(12) United States Patent
Najjar et al.

(10) Patent No.: US 9,365,943 B2
(45) Date of Patent: Jun. 14, 2016

(54) METHOD OF ELECTROPLATING UNIFORM COPPER LAYERS

(75) Inventors: Elie H. Najjar, Norwood, MA (US);
Mark Lefebvre, Hudson, NH (US);
Leon R. Barstad, Raynham, MA (US);
Michael P. Toben, Smithtown, NY (US)

(73) Assignee: Rohm and Haas Electronic Materials LLC

( * ) Notice: Subject to any disclaimer, the term of this patent is extended or adjusted under 35 U.S.C. 154(b) by 727 days.

(21) Appl. No.: 13/326,846

(22) Filed: Dec. 15, 2011

(65) Prior Publication Data

US 2012/0318676 A1 Dec. 20, 2012

Related U.S. Application Data

(60) Provisional application No. 61/423,407, filed on Dec. 15, 2010.

(51) Int. Cl.
| C25D 3/38 | (2006.01) |
| C25D 7/12 | (2006.01) |
| H01L 21/288 | (2006.01) |
| H05K 3/32 | (2006.01) |
| H05K 3/42 | (2006.01) |

(52) U.S. Cl.
CPC C25D 3/38 (2013.01); C25D 7/123 (2013.01); H01L 21/2885 (2013.01); H05K 3/423 (2013.01)

(58) Field of Classification Search
CPC ...... C25D 3/38; C25D 7/123; H01L 21/2885; H05K 3/423
USPC ......................................................... 205/298
See application file for complete search history.

(56) References Cited

U.S. PATENT DOCUMENTS

| 4,347,108 A | 8/1982 | Willis | |
| 4,376,685 A * | 3/1983 | Watson | 205/298 |
| 4,515,829 A * | 5/1985 | Deckert et al. | 427/97.2 |
| 4,555,315 A * | 11/1985 | Barbieri et al. | 205/296 |
| 5,252,196 A * | 10/1993 | Sonnenberg et al. | 205/296 |
| 5,607,570 A * | 3/1997 | Rohbani | C25D 3/38 205/291 |
| 5,667,662 A | 9/1997 | Sonnenberg et al. | |
| 6,652,731 B2 | 11/2003 | Cobley et al. | |
| 6,881,319 B2 | 4/2005 | Seita et al. | |
| 7,128,822 B2 | 10/2006 | Wang et al. | |
| 7,335,288 B2 | 2/2008 | Hardikar | |
| 7,510,639 B2 * | 3/2009 | Wang | C08G 59/184 106/1.26 |
| 7,651,934 B2 | 1/2010 | Lubomirsky et al. | |
| 7,662,981 B2 | 2/2010 | Wang et al. | |

(Continued)

FOREIGN PATENT DOCUMENTS

EP 1 978 134 A1 10/2008
KR 10-0752504 8/2007

OTHER PUBLICATIONS

STN Search showing CAS No. 49594-30-1 showing common names for 3-mercaptoprone sulfonic acid.*
Nikolić, et al, Reflection and structural analyses of mirror-bright metal coatings, J. Solid State Electrochem, 2004, 526-531, 8.
Moffat, et al, Accelerator aging effects during copper electrodeposition, Electrochemical Society and Solid State Letters, 2003, C59-C62, 6(4).
European Search Report of corresponding European Application No. 11 19 3194.
Volov et al, "Investigation of copper plating and additive interactions in the presence of Fe3+/Fe2+ redox couple," Journal of the Electrochemical Society, Apr. 15, 2011, pp. D384-D389, vol. 158, No. 6.

*Primary Examiner* — Luan Van
*Assistant Examiner* — Louis Rufo
(74) *Attorney, Agent, or Firm* — John J. Piskorski (57) ABSTRACT

Electroplating methods provide substantially uniform deposits of copper on the edges and walls of through-holes of printed circuit boards. The electroplating methods provide copper deposits which have high throwing power.

3 Claims, 2 Drawing Sheets
(2 of 2 Drawing Sheet(s) Filed in Color)

(56) References Cited

U.S. PATENT DOCUMENTS

| | | |
|---|---|---|
| 2002/0036144 A1 | 3/2002 | Lee et al. |
| 2003/0111354 A1 | 6/2003 | Hara et al. |
| 2004/0187731 A1 | 9/2004 | Wang et al. |
| 2004/0222104 A1 | 11/2004 | Wang et al. |
| 2005/0045486 A1 | 3/2005 | Sahoda et al. |
| 2007/0012576 A1 | 1/2007 | Binstead et al. |
| 2007/0099422 A1 | 5/2007 | Wijekoon et al. |
| 2008/0142370 A1 | 6/2008 | Dahms et al. |
| 2008/0269395 A1* | 10/2008 | Reddington et al. .......... 524/440 |

* cited by examiner

METHOD OF ELECTROPLATING UNIFORM COPPER LAYERS

This application claims the benefit of priority under 35 U.S.C. §119(e) to U.S. Provisional Application No. 61/423,407, filed Dec. 15, 2010, the entire contents of which application are incorporated herein by reference.

The present invention is directed to a method of electroplating uniform copper layers on the edges and walls of through-holes of substrates. More specifically, the present invention is directed to a method of electroplating uniform copper layers on the edges and walls of through-holes of substrates by adding trace amounts of 3-mercaptopropane sulfonic acid or salts thereof to the copper electroplating composition.

Methods for electroplating articles with metal coatings generally involve passing a current between two electrodes in a plating solution where one of the electrodes is the article to be plated. A typical acid copper plating solution comprises dissolved copper (usually copper sulfate), an acid electrolyte such as sulfuric acid in an amount sufficient to impart conductivity to the bath, and proprietary additives to improve the uniformity of the plating and the quality of the metal deposit. Such additives include accelerators, levelers, and suppressors, among others.

Electrolytic copper plating solutions are used in the fabrication of printed circuit boards ("PCBs"). In PCB fabrication copper is electroplated onto the walls of through-holes which were made conductive in a previous electroless copper metallization process. The copper is electroplated onto the walls of the through-holes to increase their conductivity and add structural integrity for improved PCB reliability.

An ideal PCB copper electroplated through-hole exhibits substantially uniform copper thickness from the surface of the PCB to the entrance or edge of the through-hole and through the length of the through-hole cylinder. Of particular importance is a uniform edge thickness. The edge is often referred to as a knee because of its appearance in cross-sections. Due to mismatched coefficients of thermal expansion between PCB dielectrics, such as FR-4 glass/epoxy PCBs, and the electroplated copper, stresses are created during thermal excursions such as seen during PCB assembly and operating environment. These thermal stresses are particularly high at the edge or knee of the through-hole. Such stresses may lead to cracks in the copper deposit and failure of the PCB. A typical phenomenon observed at the surface of the through-hole by the unaided eye or under magnification is flaring or tear dropping. Flaring is the thinning of copper around the through-hole. The copper is non-uniform such that one side of the through-hole is noticeably worse than the opposite side. This thinning extends from the surface of the through-hole into the hole but not to the center of the hole, hence a thin or week knee is formed. Accordingly, the thickness and uniformity, i.e., throwing power, of the electroplated copper at the knee is an important measure of the quality of the copper deposit. Knee throwing power is defined as the ratio of the thickness of the copper deposit at the knee divided by the thickness of the copper deposit at the surface of the substrate. Through-hole throwing power is defined as the ratio of the thickness of the copper deposit in the center of the through-hole divided by the thickness of the copper deposit at the surface of the substrate.

Leveling agents are a typical additive of copper electroplating solutions. They are used to improve the copper deposit uniformity and enhance throwing power by selectively suppressing the plating at areas of high solution agitation and high local charge density. Some levelers, however, may lead to copper deposits exhibiting high through-hole throwing power with low knee throwing power. Low knee throwing power is undesirable for the previously described reliability problems. Accordingly, there is a need for a method of improving the throwing power of knees of through-holes.

Methods include a) providing an electroplating composition including one or more sources of copper ions, 5-100 ppb of 3-mercaptopropane sulfonic acid, salts thereof or mixtures thereof, one or more additional brighteners, and one or more levelers; b) immersing a substrate into the electroplating composition, the substrate includes a plurality of through-holes, wherein knees and walls of the plurality of through-holes are coated with a first copper layer; and c) electroplating a substantially uniform second copper layer on the first copper layer of the knees and the walls of the plurality of through-holes.

Compositions include one or more sources of copper ions, 5-100 ppb of 3-mercaptopropane sulfonic acid, salts thereof or mixtures thereof, one or more additional brighteners and one or more levelers.

The addition of 5-100 ppb of 3-mercaptopropane sulfonic acid, salts thereof or mixtures thereof to a copper electroplating composition including one or more additional brighteners and one or more levelers provides a substantially uniform copper deposit at the knees and walls of through-holes and increases knee thickness and throwing power.

The patent or application file contains at least one drawing executed in color. Copies of this patent or patent application publication with color drawing(s) will be provided by the Office upon request and payment of the necessary fee.

As used throughout this specification, the following abbreviations shall have the following meanings, unless the context clearly indicates otherwise: A=amperes; $A/dm^2$=amperes per square decimeter; ° C.=degrees Centigrade; g=gram; mg=milligram; L=liter; ppb=parts per billion; ppm=parts per million; mmol=millimoles; μm=micron=micrometer; mm=millimeters; cm=centimeters; DI=deionized; SEM=scanning electron micrograph; and mL=milliliter. All amounts are percent by weight and all ratios are molar ratios, unless otherwise noted. All numerical ranges are inclusive and combinable in any order, except where it is clear that such numerical ranges are constrained to add up to 100%.

As used throughout this specification, the term "bath" and "composition" are used interchangeably. "Deposition" and "plating" are used interchangeably throughout this specification. "Halide" refers to fluoride, chloride, bromide and iodide. Likewise, "halo" refers to fluoro, chloro, bromo and iodo. The term "alkyl" includes linear, branched and cyclic alkyl. A "suppressor" refers to an organic additive that suppresses the plating rate of a metal during electroplating. The terms "printed circuit boards" and "printed wiring boards" are used interchangeably throughout this specification. The term "knee" and "edge" are used interchangeably throughout this specification. The articles "a" and "an" refer to the singular and the plural.

The aqueous electroplating compositions and methods are useful in providing substantially uniform plated copper layers on a substrate, such as a printed circuit board (PCB). The compositions and methods increase thickness and improve the throwing power of the edges or knees of through-holes and on the walls of through-holes. In addition, the compositions and methods do not compromise the overall throwing power of the through-holes or the balance of the overall through-hole throwing power. PCBs typically contain a number of through-holes having a variety of sizes. Through-holes in a PCB may have a variety of diameters, such as from 50 μm to 1 mm in diameter. Such through-holes may vary in depth, such as from 35 μm to 8 mm and greater.

3-mercaptopropane sulfonic acid, salts thereof, such as 3-mercatopropane sulfonic acid, sodium salt, or mixtures of the acid and salts are included in the copper electroplating compositions in amounts of 5-100 ppb or such as from 25-100 ppb or such as 10-50 ppb. If the amount of 3-mercaptopropane sulfonic acid or its salts exceed 100 ppb, overall through-hole throwing power, including the throwing power of the knees, degrades. Degrading of knee throwing power is observed as flaring. The 3-mercaptopropane sulfonic acid, salts thereof and mixtures are added to the copper electroplating compositions at the initial make-up of the electroplating compositions without adding additional amounts during the life of the electroplating composition and the electroplating cycle. The addition of the 3-mercaptopropane sulfonic acid, salts thereof or mixtures thereof is only added once and just prior to electroplating.

In addition to the 3-mercaptopropane sulfonic acid, its salts and mixtures thereof, which have brightener activity, one or more additional brighteners are included in the copper electroplating compositions. Such brighteners include, but are not limited to, sulfur containing compounds, such as sulfopropyldisulfide, its salts thereof, such as sulfopropyldisulfide, sodium and potassium salts or mixtures thereof, 2-mercaptoethanesulfonic acid (sodium salt), and bissulfopropyl disulfide. Such compounds are disclosed in U.S. Pat. Nos. 3,770, 598, 4,374,709, 4,376,685, 4,555,315 and 4,673,469. Other sulfur containing brighteners include, but are not limited to, N,N-dimethyldithiocarbamic acid (3-sulfopropyl) ester, sodium salt, (O-ethyldithiocarbonato)-S-(3-sulfopropyl)-ester, potassium salt, 3-[(amino-iminomethyl)-thio]-1-propanesulfonic acid, 3-(2-benzthiazolylthio)-1-propanesulfonic acid, sodium salt and the thiol of bissulfopropyl disulfide. Such additional brighteners are included in amounts of 0.1 mg/L to 200 mg/L, or such as from 1 mg/L to 50 mg/L.

The copper electroplating compositions also contain a source of copper ions, an electrolyte, and a leveling agent. Conventional additives may also be included in the electroplating compositions to tailor the operation of the electroplating process to optimize performance for a specific substrate.

Any copper ion source that is at least partially soluble in the electroplating bath is suitable. Preferably, the copper ion source is soluble in the electroplating bath. Suitable copper ion sources are copper salts and include without limitation: copper sulfate; copper halides such as copper chloride; copper acetate; copper nitrate; copper fluoroborate; copper alkylsulfonates; copper arylsulfonates; copper sulfamate; and copper gluconate. Exemplary copper alkylsulfonates include copper ($C_1$-$C_6$)alkylsulfonate and more typically copper ($C_1$-$C_3$)alkylsulfonate. Typical copper alkylsulfonates are copper methanesulfonate, copper ethanesulfonate and copper propanesulfonate. Exemplary copper arylsulfonates include, without limitation, copper phenyl sulfonate, copper phenol sulfonate and copper p-toluene sulfonate. Typically copper sulfate pentahydrate and copper methanesulfonic acid are used. Mixtures of copper ion sources may be used. One or more salts of metal ions other than copper ions may be advantageously added to the present electroplating baths. The addition of such other metal ion sources is useful in the deposition of copper alloys. Such copper salts are generally commercially available and may be used without further purification.

The copper salts may be used in the aqueous electroplating baths in any amount that provides sufficient copper ion concentration for electroplating copper on a substrate. Typically, the copper salt is present in an amount sufficient to provide an amount of copper metal of 10 to 180 g/L of plating solution. Alloys, such as copper-tin, for example, copper having up to 2% by weight tin, may be advantageously plated. Other suitable copper alloys include, but are not limited to copper-silver, tin-copper-silver, and tin-copper-bismuth. The amount of each of the metal salts in such mixtures depends upon the particular alloy to be plated and is well known to those skilled in the art.

Electrolytes may be alkaline or acidic. Suitable acidic electrolytes include, but are not limited to, sulfuric acid, fluoroboric acid, alkanesulfonic acids such as methanesulfonic acid, ethanesulfonic acid, propanesulfonic acid and trifluoromethane sulfonic acid, arylsulfonic acids such as phenyl sulfonic acid, phenol sulfonic acid and toluene sulfonic acid, sulfamic acid, hydrochloric acid, and phosphoric acid. Mixtures of acids may be used in the present metal plating baths. Typical acids include sulfuric acid, methanesulfonic acid, ethanesulfonic acid, propanesulfonic acid, and mixtures thereof. The acids are typically present in an amount in the range of from 1 to 300 g/L, or such as from 5 to 250 g/L, or such as from 10 to 225 g/L. Electrolytes are generally commercially available from a variety of sources and may be used without further purification.

Such electrolytes may contain a source of halide ions, manganese ions, ferrous ions or mixtures thereof as well as other conventional ions, such as ions from transition metal salts. Halide ions are typically chloride ions. A wide range of such ions may be used. Typically, the ion concentrations are in the range of from 0 to 100 ppm based on the electroplating bath, or such as from 10 to 100 ppm, or such as from 20 to 75 ppm. Sources of such ions are generally commercially available and may be used without further purification.

Any compound capable of suppressing the copper plating rate may be used as a suppressor in the electroplating baths. Suitable suppressors include, but are not limited to, polymeric materials, such as those having heteroatom substitution, and those having oxygen substitution. Exemplary suppressors are high molecular weight polyethers, such as those of the formula R—O—(CXYCX'Y'O)$_n$R' where R and R' are independently chosen from H, ($C_2$-$C_{20}$)alkyl group and ($C_6$-$C_{10}$)$_{aryl}$ group; each of X, Y, X' and Y' is independently selected from hydrogen, alkyl such as methyl, ethyl or propyl, aryl such as phenyl, or aralkyl such as benzyl; and n is an integer from 5 to 100,000. Typically, one or more of X, Y, X' and Y' is hydrogen. Preferred suppressors include commercially available polypropylene glycol copolymers and polyethylene glycol copolymers, including ethylene oxide-propylene oxide ("EO/PO") copolymers and butyl alcohol-ethylene oxide-propylene oxide copolymers. Suitable butyl alcohol-ethylene oxide-propylene oxide copolymers are those having a weight average molecular weight of 500 to 10,000, and preferably 1000 to 10,000. When such suppressors are used, they are typically present in an amount in the range of from 1 to 10,000 ppm based on the weight of the electroplating composition, and preferably from 5 to 10,000 ppm.

Leveling agents may be polymeric or non-polymeric. Suitable polymeric leveling agents include, without limitation, polyethylenimine, polyamidoamines and reaction products of an amine with an epoxide. Such amines may be primary, secondary or tertiary alkyl amines, aryl amines or may be heterocyclic amines. Exemplary amines include, but are not limited to, dialkylamines, trialkylamines, arylalkylamines, diarylamines, imidazole, triazole, tetrazole, benzimidazole, benzotriazole, piperidine, morpholine, piperazine, pyridine, oxazole, benzoxazole, pyrimidine, quonoline, and isoquinoline. Any epoxy group-containing compound that can react with the amine is suitable as the epoxide. Suitable epoxides include, but are not limited to, epihalohydrin such as epichlorohydrin and epibromohydrin, and polyepoxide compounds.

Derivatives of polyethylenimines and polyamidoamines may also be used as leveling agents. Such derivatives include, without limitation, reaction products of a polyethylenimine with an epoxide and reaction products of a polyamidoamine with an epoxide.

Examples of suitable reaction products of amines with epoxides are those disclosed in U.S. Pat. Nos. 3,320,317; 4,038,161; 4,336,114; and 6,610,192. The preparation of the reaction products of certain amines and certain epoxides are well known, see, e.g., U.S. Pat. No. 3,320,317 and German Patent App. No. DE 196 43 091. Reactions of amines with epoxides are also disclosed in U.S. Pat. No. 7,662,981.

In one embodiment, levelers may include reaction products of at least one imidazole compound of the formula wherein $R^1$, $R^2$ and $R^3$ are independently chosen from H, $(C_1-C_{12})$alkyl, $(C_2-C_{12})$alkenyl, and aryl and provided that $R^1$ and $R^2$ are not both H. That is, the reaction products contain at least one imidazole wherein at least one of $R^1$ and $R^2$ is $(C_1-C_{12})$alkyl, $(C_2-C_{12})$alkenyl, or aryl. Such imidazole compound is substituted with a $(C_1-C_{12})$alkyl, $(C_2-C_{12})$alkenyl, or aryl at the 4- and/or 5-position. Preferably, $R^1$, $R^2$ and $R^3$ are independently chosen from H, $(C_1-C_8)$alkyl, $(C_2-C_7)$alkenyl and aryl, more preferably H, $(C_1-C_6)$alkyl, $(C_3-C_7)$alkenyl and aryl, and even more preferably H, $(C_1-C_4)$alkyl, $(C_3-C_6)$alkenyl and aryl. The $(C_1-C_{12})$alkyl groups and the $(C_2-C_{12})$alkenyl groups may each optionally be substituted with one or more of hydroxyl groups, halogen, and aryl groups. Preferably, the substituted $(C_1-C_{12})$alkyl group is an aryl-substituted $(C_1-C_{12})$alkyl group, and more preferably is are $(C_1-C_4)$alkyl. Exemplary are $(C_1-C_4)$alkyl groups include, without limitation, benzyl, phenethyl, and methylnaphthyl. Alternatively, each of the $(C_1-C_{12})$alkyl groups and the $(C_2-C_{12})$alkenyl groups may contain a cyclic alkyl or cyclic alkenyl group, respectively, fused with an aryl group. As used herein, the term "aryl" refers to any organic radical derived from an aromatic or heteroaromatic moiety by the removal of a hydrogen atom. Typically, the aryl group contains 6-12 carbon atoms. The aryl group in the present invention may optionally be substituted with one or more of $(C_1-C_4)$alkyl and hydroxyl. Exemplary aryl groups include, without limitation, phenyl, tolyl, xylyl, hydroxytolyl, phenolyl, naphthyl, furanyl, and thiophenyl. The aryl group is preferably phenyl, xylyl or naphthyl. Exemplary $(C_1-C_{12})$ alkyl groups and substituted $(C_1-C_{12})$alkyl groups include, without limitation, methyl, ethyl, n-propyl, iso-propyl, n-butyl, iso-butyl, sec-butyl, n-pentyl, 2-pentyl, 3-pentyl, 2-(2-methyl)butyl, 2-(2,3-dimethyl)butyl, 2-(2-methyl)pentyl, neopentyl, hydroxymethyl, hydroxyethyl, hydroxypropyl, cyclopentyl, hydroxcyclopentyl, cyclopentylmethyl, cyclopentylethyl, cyclohexyl, cyclohexylmethyl, hydroxycyclohexyl, benzyl, phenethyl, naphthylmethyl, tetrahydronaphthalenyl, and tetrahydronaphthylmethyl. Exemplary $(C_2-C_8)$ alkenyl groups include, but are not limited to, allyl, styrenyl, cyclopentenyl, cyclopentylmethyl, cyclopentenylethyl, cyclohexenyl, cyclohexenylmethyl, and indenyl. Typically, the at least one imidazole compound is substituted with a $(C_1-C_8)$alkyl, $(C_3-C_7)$alkenyl, or aryl at the 4- or 5-position. More typically, the at least one imidazole is substituted with $(C_1-C_6)$alkyl, $(C_3-C_7)$alkenyl, or aryl at the 4- or 5-position. Still more typically, at least one imidazole is substituted at the 4- or 5-position with methyl, ethyl, propyl, butyl, allyl or aryl. The useful imidazole compounds are generally commercially available from a variety of sources, such as Sigma-Aldrich (St. Louis, Mo.) or may be prepared from literature methods.

Any suitable epoxide-containing compound may be used to make the reaction products. Such epoxide-containing compounds may contain 1 or more epoxide groups, and typically contain 1, 2 or 3 epoxide groups, and preferably contain 1 or 2 epoxide groups. Suitable epoxide-containing compounds useful in the present invention are those of the formulae E-I, E-II, or E-III where Y, $Y^1$ and $Y^2$ are independently chosen from H and $(C_1-C_4)$alkyl; X=halogen; A=$OR^4$ or $R^5$; $R^4$=$((CR^6R^7)_mO)_n$, $(aryl-O)_p$, $CR^6R^7$—Z—$CR^6R^7O$ or $OZ^1_tO$; $R^5$=$(CH_2)_y$; A1 is $(C_5-C_{12})$cycloalkyl; Z=a 5- or 6-membered ring; $Z^1$ is $R^{12}OArOR^{12}$, $(R^{13}O)_aAr(OR^{13})_a$, or $(R^{13}O)_aCy(OR^{13})_a$; Cy=$(C_5-C_{12})$cycloalkyl; each $R^6$ and $R^7$ are independently chosen from H, $CH_3$ and OH; each $R^{11}$ represents $(C_1-C_4)$ alkyl or $(C_1-C_4)$alkoxy; each $R^{12}$ represents $(C_1-C_8)$alkyl; each $R^{13}$ represents a $(C_2-C_6)$alkyleneoxy; each a=1-10; m=1-6; n=1-20; p=1-6; q=1-6; r=0-4; t=1-4; and y=0-6; wherein Y and $Y^1$ may be taken together to form a $(C_8-C_{10})$ cyclic compound. Preferably Y=H and X=Cl or Br, and more preferably, X=Cl. $Y^1$ and $Y^2$ are preferably independently chosen from H and $(C_1-C_2)$alkyl. When $Y^1$ and $Y^2$ are not joined to form a cyclic compound, it is typical that $Y^1$ and $Y^2$ are both H. When $Y^1$ and $Y^2$ are joined to form a cyclic compound, it is typical that A is $R^5$ or a chemical bond and that a $(C_8-C_{10})$carbocyclic ring is formed. It is typical that m=2-4. Typically, n=1-10. It is further typical that m=2-4 when n=1-10. Phenyl-O is the typical aryl-O group for $R^4$. It is typical that p=1-4, more typically 1-3, and still more typically 1-2. Z is typically a 5- or 6-membered carbocyclic ring and, more typically, Z is a 6-membered carbocyclic ring.

Typically, y=0-4, and more typically 1-4. When A=$R^5$ and y=0, then A is a chemical bond. Typically, m=1-6, and more typically 1-4. It is typical that q=1-4, more typically 1-3, and still more typically 1-2. Typically, r=0 and q=1, and more typically $Y^1$ and $Y^2$=H, r=0 and q=1. Typically, $Z^1$=$R^{12}$OArO$R^{12}$ or $(R^{13}O)_a$Ar$(OR^{13})_a$. Each $R^{12}$ is typically $(C_1-C_6)$alkyl and more typically $(C_1-C_4)$alkyl. Each $R^{13}$ is typically $(C_2-C_4)$alkyleneoxy. It is typical that t=1-2. Typically, a=1-8, more typically 1-6 and still more typically 1-4.

Exemplary epoxide-containing compounds of formula E-I are epihalohydrins. Typically, the epoxide-containing compound is epichlorohydrin or epibromohydrin, and more typically, epichlorohydrin.

Suitable compounds of formula E-II where $R^4$=$((CR^6R^7)_mO)_n$ are those of the formula:

(E-IIa)

where $Y^1$, $Y^2$, $R^6$, $R^7$, n and m are as defined above. Preferably, $Y^1$ and $Y^2$ are both H. When m=2, it is typical that each $R^6$ is H, $R^7$ is chosen from H and $CH_3$, and n=1-10. When m=3, it is typical that at least one $R^7$ is chosen from $CH_3$ and OH, and n=1. When m=4, it is typical that both $R^6$ and $R^7$ are H, and n=1. Exemplary compounds of formula E-IIa include, but are not limited to: 1,4-butanediol diglycidyl ether, ethylene glycol diglycidyl ether, di(ethylene glycol) diglycidyl ether, poly(ethylene glycol) diglycidyl ether compounds, glycerol diglycidyl ether, neopentyl glycol diglycidyl ether, propylene glycol diglycidyl ether, di(propylene glycol) diglycidyl ether, and poly(propylene glycol) diglycidyl ether compounds. Poly(ethylene glycol) diglycidyl ether compounds of formula E-IIa are those compounds where each of $R^6$ and $R^7$=H, m=2, and n=3-20, and typically n=3-15, more typically n=3-12, and still more typically n=3-10. Exemplary poly(ethylene glycol) diglycidyl ether compounds include tri(ethylene glycol) diglycidyl ether, tetra(ethylene glycol) diglycidyl ether, penta(ethylene glycol) diglycidyl ether, hexa(ethylene glycol) diglycidyl ether, nona(ethylene glycol) diglycidyl ether, deca(ethylene glycol) diglycidyl ether, and dodeca(ethylene glycol) diglycidyl ether. Poly(propylene glycol) diglycidyl ether compounds of formula E-IIa are those compounds where each of $R^6$=H and one of $R^7$=$CH_3$, m=2, and n=3-20, and typically n=3-15, more typically n=3-12, and still more typically n=3-10. Exemplary poly(propylene glycol) diglycidyl ether compounds include tri(propylene glycol) diglycidyl ether, tetra(propylene glycol) diglycidyl ether, penta(propylene glycol) diglycidyl ether, hexa(propylene glycol) diglycidyl ether, nona(propylene glycol) diglycidyl ether, deca(propylene glycol) diglycidyl ether, and dodeca(propylene glycol) diglycidyl ether. Suitable poly(ethylene glycol) diglycidyl ether compounds and poly(propylene glycol) diglycidyl ether compounds are those having a number average molecular weight of from 350 to 10000, and typically from 380 to 8000.

Suitable compounds of formula E-II where $R^4$=$(aryl-O)_p$ are those having the formulae E-IIb and E-IIc:

(E-IIb)

(E-IIc)

where $Y^1$, $Y^2$ and p are as defined above, and each $R^{11}$ represents $(C_1-C_4)$alkyl or $(C_1-C_4)$alkoxy, and r=0-4. Typically, r=0 and p=1, and more typically $Y^1$ and $Y^2$=H, r=0 and p=1.

In compounds of formula E-II where $R^4$=$CR^6R^7$—Z—$CR^6R^7$O, Z represents a 5- or 6-membered ring. In such ring structures, the $CR^6R^7$ groups may be attached at any position, such as at adjacent atoms of the ring or at any other atoms of the ring. Particularly suitable compounds of formula E-II where $R^4$=$CR^6R^7$—Z—$CR^6R^7$O are those having the formula (E-IId)

where $Y^1$, $Y^2$, $R^6$ and $R^7$ are as defined above, and q=0 or 1. When q=0, the ring structure is a 5-membered carbocyclic ring and when q=1, the ring structure is a 6-membered carbocyclic ring. Typically, $Y^1$ and $Y^2$=H. More typically, $Y^1$ and $Y^2$=H and q=1. Typically compounds of formula E-II where $R^4$=$CR^6R^7$—Z—$CR^6R^7$O are 1,2-cyclohexanedimethanol diglycidyl ether and 1,4-cyclohexanedimethanol diglycidyl ether.

When A=$R^5$, suitable compounds of formula E-II are those having the formula:

(E-IIe)

where $Y^1$, $Y^2$ and y are as defined above. It is typical that y=0-4, more typically y=1-4, and y=2-4. Exemplary compounds of formula E-IIe include, without limitation, 1,5-diepoxyhexane, 1,7-diepoxyoctane, and 1,9-diepoxydecane.

In compounds of formula II where A=OZ¹,O, typical compounds are those of the formula wherein $Y^1$ and $Y^2$ are as defined above.

Suitable epoxy-containing compounds of formula E-III may be monocyclic, spirocyclic, fused and/or bicyclic rings. Typical epoxide-containing compounds of formula E-III include 1,5-diepoxy-cyclooctane, 1,6-diepoxy-cyclodecane and dicyclopentadiene dioxide.

The useful epoxide-containing compounds can be obtained from a variety of commercial sources, such as Sigma-Aldrich, or can be prepared using a variety of literature methods known in the art.

The reaction products can be prepared by reacting one or more benzimidazole compounds described above with one or more epoxide-containing compounds described above. Typically, a desired amount of the benzimidazole and epoxy-containing compounds are added into the reaction flask, followed by addition of water. The resulting mixture is heated to approximately to 75-95° C. for 4 to 6 hours. After an additional 6-12 hours of stirring at room temperature, the resulting reaction product is diluted with water. The reaction product may be used as-is in aqueous solution, may be purified or may be isolated as desired.

In general, the leveling agents have a number average molecular weight (Mn) of 500 to 10,000, although reaction products having other Mn values may be used. Such reaction products may have a weight average molecular weight (Mw) value in the range of 1000 to 50,000, although other Mw values may be used. Typically, Mw is from 1000 to 20,000. In one embodiment, Mw is 1500 to 5000. In another embodiment, Mw is 5000 to 15,000.

Typically, the ratio of the imidazole compound to the epoxide-containing compound is from 0.1:10 to 10:0.1. Typically, the ratio is from 0.5:5 to 5:0.5 and more typically from 0.5:1 to 1:0.5. Other suitable ratios of imidazole compound to epoxide-containing compound may be used to prepare the leveling agents.

In another embodiment, at least one leveling agent in the present mixture is a reaction product of an amine with an epihalohydrin. Typically, the amine is imidazole and the epihalohydrin is epichlorohydrin. However, other epihalohydrins such as epibromohydrin may be used. In still another embodiment, at least one leveling agent in the present mixture is a reaction product of an amine with a polyepoxide compound. In a further embodiment, the amine is imidazole and the polyepoxide compound is a diepoxide compound of formula (E-IIg) below:

The methods of depositing a conductive seed layer on the knees and walls of through-holes of PCBs include electroless plating. Electroless methods and compositions for plating copper on PCBs and through-holes are well known in the art. Conventional methods and electroless copper plating baths may be used. Examples of such methods and electroless copper baths are described in U.S. Pat. No. 4,563,217 and U.S. Pat. No. 4,751,106. Such copper layers may range in thickness of 1 μm to 5 μm. The PCB is contacted with the copper electroplating bath described above; and then applying a current density for a period of time sufficient to deposit a second copper layer on the first copper layer.

wherein $R^{16}$ is $(C_1\text{-}C_{10})$alkyl; and $R^{14}$ and $R^{15}$ are independently chosen from H and $R^{16}$, wherein $n_1$=1-20. Typically, $n_1$=1-10 and more typically $n_1$=1-5. In one embodiment, $n_1$=1. In a further embodiment, $R^{14}$ and $R^{15}$ are both H. In another embodiment, $R^{16}$ is optionally substituted. By "substituted" it is meant that one or more hydrogens are replaced with one or more substituent groups, such as hydroxyl, $(C_1\text{-}C_4)$alkoxy, thiol, amino, $(C_1\text{-}C_4)$alkylamino, and $di(C_1\text{-}C_4)$alkylamino. While the polyepoxide compounds of formula (E-IIg) have two epoxy groups, polyepoxide compounds having three or more epoxy groups may be used as well.

Exemplary reaction products of a compound including a heteroatom chosen from nitrogen, sulfur and a mixture of nitrogen and sulfur, with a polyepoxide compound containing an ether linkage compounds of formula (E-IIg) have a number average molecular weight (as determined by gel permeation chromatography) of 500 to 25,000, although such reaction products having other number average molecular weights may be used. More typically, such reaction products have a number average molecular weight of 1000 to 15,000 and still more typically from 1250 to 5000. In general, the reaction products of a heteroatom chosen from nitrogen, sulfur and a mixture of nitrogen and sulfur, with a polyepoxide compound containing an ether linkage compounds of formula (E-IIg) have a molecular weight polydispersity of 1 to 5, more typically 1 to 4 and still more typically 1 to 2.5. In one embodiment, the polydispersity is from 1 to 2.

Suitable non-polymeric leveling agents include, without limitation, non-polymeric sulfur-containing and non-polymeric nitrogen-containing compounds. Exemplary sulfur-containing leveling compounds include thiourea and substituted thioureas. Exemplary nitrogen-containing compounds include primary, secondary and tertiary amines. Such amines may be alkyl amines, aryl amines, and cyclic amines (i.e. cyclic compounds having a nitrogen as a member of the ring). Suitable amines include, but are not limited to, dialkylamines, trialkylamines, arylalkylamines, diarylamines, imidazole, triazole, tetrazole, benzimidazole, benzotriazole, piperidine, morpholine, piperazine, pyridine, oxazole, benzoxazole, pyrimidine, quonoline, and isoquinoline. The non-polymeric amines may be unsubstituted or substituted. By "substituted", it is meant that one or more of the hydrogens are replaced by one or more substituent groups. A wide variety of substituent groups may be used, including amino, alkylamino, dialkylamino, alkyl, aryl, alkenyl, alkoxyl, and halo. Other suitable non-polymeric leveling agents include nigrosines, pentamethyl-para-rosaniline hydrohalide, hexamethyl-para-rosaniline hydrohalide and compounds containing a functional group of the formula N—$R^{17}$—S, where $R^{17}$ is a substituted alkyl, unsubstituted alkyl, substituted aryl or unsubstituted aryl. Typically, the alkyl groups are ($C_1$-$C_6$)alkyl and typically ($C_1$-$C_4$)alkyl. In general, the aryl groups include ($C_6$-$C_{20}$)aryl, typically (C6-C10)aryl. Such aryl groups may further include heteroatoms, such as sulfur, nitrogen and oxygen. Typically the aryl group is phenyl or napthyl.

The leveling agents may also possess functionality capable of acting as a suppressor. Such compounds may be dual-functioning, i.e. they may function as leveling agents and as suppressors.

The electroplating baths may optionally contain additional leveling agents that can be used in combination with the leveling agents described above include, without limitations, those disclosed in U.S. Pat. No. 6,610,192 (Step et al.), U.S. Pat. No. 7,128,822 (Wang et al.), U.S. Pat. No. 7,374,652 (Hayashi et al.), and U.S. Pat. No. 6,800,188 (Hagiwara et al.).

The amount of the leveling agent used in the electroplating baths may depend upon the particular leveling agents selected, the concentration of the metal ions in the electroplating bath, the particular electrolyte used, the concentration of the electrolyte and the current density applied. In general, the total amount of the leveling agent in the electroplating bath is from 0.01 ppm to 5000 ppm based on the total weight of the electroplating bath, although greater or lesser amounts may be used. Typically, the total amount of the leveling agent is from 0.25 to 5000 ppm and more typically from 0.25 to 1000 ppm and still more typically from 0.25 to 100 ppm.

Optionally, one or more aldehydes, one or more carboxylic acids or mixtures thereof may be included in the copper electroplating compositions to stabilize the compositions. Acid anhydrides also may be included. During the electroplating cycle 3-mercaptopropane sulfonic acid and its salts may decompose to levels below 5 ppb. Adding one or more aldehydes or one or more carboxylic acids or acid anhydrides or mixtures thereof to the electroplating compositions inhibits the decomposition of the 3-mercaptopropnae sulfonic acid and its salts and maintains them at the desired levels of 5-100 ppb during electroplating. Aldehydes and acids are included in the electroplating compositions in amounts of 25 ppm and greater or such as 25 ppm to 100 ppm or such as from 50 ppm to 75 ppm. Typically aldehydes are included to stabilize the compositions. Aldehyde and carboxylic acid levels may be maintained by conventional carbon polish processes well known in the plating arts.

Carboxylic acids which may be included in the compositions include, but are not limited to, monocarboxylic acids and polycarboxylic acids including di- and tri-carboxylic acids. Examples of carboxylic acids are acetic acid and its anhydride, formic acid, citric acid, succinic acid, tartaric acid, propionic acid, butyric acid, isobutyric acid, valeric acid, isovaleric acid, oxalic acid, malonic acid, succinic acid, glutaric acid, adipic acid, acrylic acid, methacrylic acid, crotonic acid, maleic acid, fumaric acid, citraconic acid and mesaconic acid.

Aldehydes include, but are not limited to, $R^{18}$—CHO, where $R^{18}$ is —H, ($C_1$-$C_{20}$) linear, branched, or cyclic alkyl; ($C_2$-$C_{20}$) linear, branched, or cyclic alkenyl; ($C_2$-$C_{20}$) linear or branched alkynyl; ($C_1$-$C_{20}$) alkyl-O($C_2$-$C_3$O)$_{x1}$$R^{19}$; ($C_1$-$C_{12}$) alkyphenyl-O($C_2$-$C_3$O)$_{x1}$$R^{19}$; or -phenyl-O($C_2$-$C_3$O)$_{x1}$$R^{19}$; where X1 is an integer of from 1-500 and $R^{19}$ is hydrogen, ($C_1$-$C_4$) alkyl or phenyl; the ($C_1$-$C_{20}$) alkyl, ($C_2$-$C_{20}$) alkenyl, and ($C_2$-$C_{20}$) alkynyl may be unsubstituted or substituted.

Substituents on the ($C_1$-$C_{20}$) alky, ($C_2$-$C_{20}$) alkenyl and the ($C_2$-$C_{20}$) alkynyl groups include, but are not limited to, halogen, aryl, —SH, —CN, —SCN, —C=NS, silyl, silane, —Si(OH)$_3$, —NO$_2$, SO$_3$M, —PO$_3$M, —P($R^{22}$)$_2$, —OH, —COOH, —CHO, —COO($C_1$-$C_{12}$) alkyl, —CO($C_1$-$C_{12}$) alkyl, or NR$^{21}$R$^{20}$, where $R^{20}$ and $R^{21}$ are independently hydrogen, aryl, or ($C_1$-$C_{12}$) alkyl; and M is H, or a counter ion of alkali metal Li, Na, K, Rb, or Cs, and $R^{22}$ is H, or a halogen F, Cl, Br, or I.

Cyclic alkenyls and aryl groups include, but are not limited to, phenyl, biphenyl, naphthyl, anthryl, phenanthryl, furanyl, pyridinyl and pyrimidinyl.

Typical aldehydes are alicyclic and aromatic aldehydes such as the ($C_1$-$C_{20}$) cyclic alkyl, and the ($C_2$-$C_{20}$) cyclic alkenyl, or an aldehyde with an aryl substituent group. Aromatic groups include, but are not limited to, phenyl, biphenyl, naphthyl, and furanyl.

Examples of specific aldehydes are formaldehyde, acetaldehyde, glutaraldehyde, 2,3,4-trihydroxybenzaldehyde, 3-hydroxybenzaldehyde, 3,4,5-trihydroxybenzaldehyde, 2,4-dihydroxybenzaldehyde, 4-hydroxy-3-methoxy cinnamaldehyde, 3,4,5-trihydroxybenzaldehyde monohydrate, syringealdehyde, 2,5-dihydroxybenzaldehyde, 2,4,5-trihydroxybenzaldehyde, 3,5-hydroxybenzaldehyde, 3,4-dihydroxybenzaldehyde, 4-hydroxybenzaldehyde, 4-carboxybenzaldehyde, 2-chloro-4-hydroxybenzaldehyde, 3-furanaldehyde, and benzaldehyde.

Examples of other aldehydes include, but are not limited to, pyridine carboxaldehyde, benzaldehyde, naphthaldehyde, biphenyl aldehyde, anthracene aldehyde, phenanthracene aldehyde, 2-formyl phenoxy acetic acid, 2,3,4-trihydroxybenzaldehyde, 3-hydroxybenzaldehyde, 3,4,5-trihydroxybenzaldehyde, 2,4-dihydroxybenzaldehyde, 4-hydroxy-3-methoxy cinnamaldehyde, 3,4,5-trihydroxybenzaldehyde monohydrate, and syringealdehyde.

The methods of depositing a conductive seed layer on the knees and walls of through-holes of PCBs include electroless plating. Electroless methods and compositions for plating copper on PCBs and through-holes are well known in the art. Conventional methods and electroless copper plating baths may be used. Examples of such methods and electroless copper baths are described in U.S. Pat. No. 4,563,217 and U.S. Pat. No. 4,751,106. Such copper layers may range in thickness of 1 μm to 5 μm. The PCB is contacted with the copper electroplating bath described above; and then applying a current density for a period of time sufficient to deposit a second copper layer on the first copper layer.

The electroplating baths may be used at any suitable temperature, such as from 10 to 65° C. or higher. Typically, the temperature of the plating baths is from 10 to 35° C. and more typically from 15 to 30° C.

In general, the aqueous electroplating baths are agitated during use. Any suitable agitation method may be used with the present invention and such methods are well-known in the art. Suitable agitation methods include, but are not limited to, air sparging, work piece agitation, and impingement.

Typically, a substrate is electroplated by contacting the substrate with the plating bath. The substrate typically functions as the cathode. The plating bath contains an anode, which may be soluble or insoluble. Potential is typically applied to the cathode. Sufficient current density is applied and plating performed for a period of time sufficient to deposit a copper layer having a desired thickness on the substrate as well as on the knees and walls of through holes.

Suitable current densities, include, but are not limited to, the range of 0.05 to 10 A/dm² or such as 1 A/dm² to 5 A/dm². The specific current density depends in part upon the substrate to be plated and the leveling agent selected. Such current density choice is within the abilities of those skilled in the art.

The addition of 5-100 ppb or such as from 25-100 ppb or such as from 10-50 ppb of 3-mercaptopropane sulfonic acid, salts thereof or mixtures thereof in combination with one or more additional brighteners to a copper electroplating composition provides a substantially uniform copper deposit at the knees and walls of through-holes, thus improving the knee and through-hole throwing power. The throwing power of the knees may range from 80% and higher or such as from 85% and higher or such as from 85% to 90%. The overall through-hole throwing power may range from 80% and higher or such as from 85% and higher or such as 85% to 90%. Accordingly, the methods provide a good balance between the throwing power of the knee and the through-holes. The substantially uniform copper over the entire surface improves reliability, i.e., resistance to cracking, during thermal excursions, such as during reflow, assembly and or environment in end use. By definition higher throwing power for both the through-holes and knees means a substantially uniform copper thickness on the substrate.

The following examples are included to further illustrate the invention but are not intended to limit its scope.

EXAMPLE 1

A copper plating bath was prepared by combining 75 g/L copper as copper sulfate pentahydrate, 240 g/L sulfuric acid, 50 ppm chloride ion, 0.3 g/L of aqueous manganese sulfate solution, 1 mg/L of sulfopropyldisulfide, 100 ppb 3-mercaptopropane sulfonic acid, sodium salt, and 1.5 g/L of a suppressor. The suppressor was an EO/PO copolymer having a molecular weight of <5,000 and terminal hydroxyl groups. The plating bath also contained 5 mg/L of a leveler which was the reaction product of 63 mmol 1,4-butanediol diglycidyl ether, 25 mmol imidazole and 75 mmol 4-phenylimidazole. Analysis of the reaction product showed the following peaks: δ ppm: 9.22-7.22 (m, 24H, $H_{arom}$); 4.52-3.00 (m, 37.2H (2.65×14 H), 4-$CH_2$—O, 2CH—OH, 2$CH_2$—N); and 1.74-1.24 (m, 10.6H (2.653×4H), 2$CH_2$).

EXAMPLE 2

Figure 1:
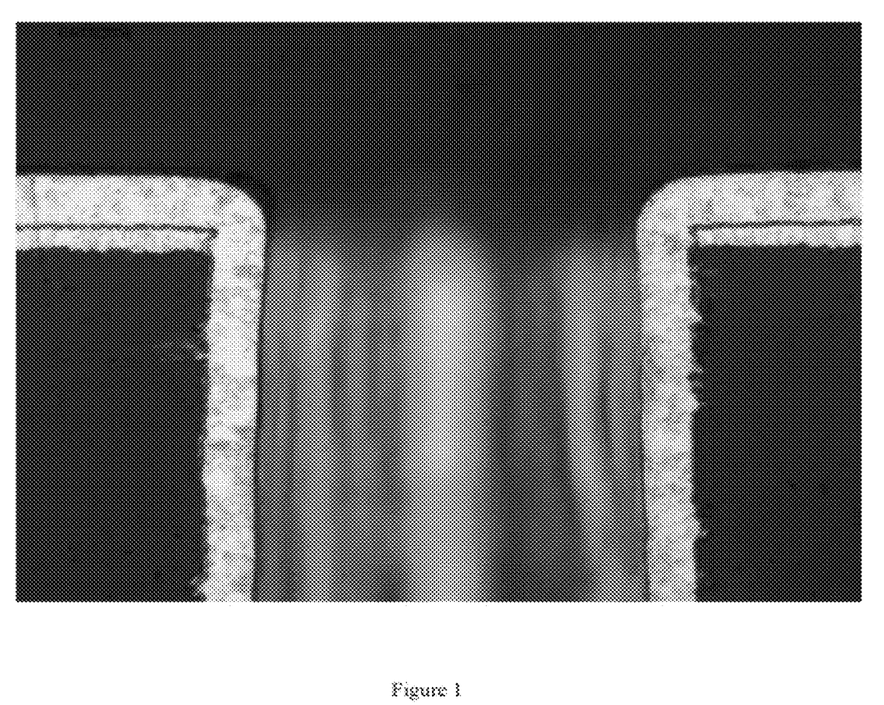
FIG. 1 is a 5000× cross-section of a through-hole 0.3 mm in diameter of an FR-4/glass-epoxy PCB with uniform copper deposits on each knee and wall of the through-hole.

A sample (2.4 mm thick) of a double-sided FR4 PCB (5×9.5 cm) having through-holes with an average diameter of 0.3 mm were first electrolessly plated with a thin copper seed layer of 1-3 μm using a conventional electroless copper plating bath. The sample was then plated in a Haring cell using the copper plating bath of Example 1. The temperature of the bath was 25° C. A current density of 2 A/dm² was applied to the sample for 80 minutes. The copper plated sample was analyzed to determine the throwing power at the knees and the through-holes. The sample was cross-sectioned at multiple sections to visually compare and measure the thickness of the copper deposit at the knees and the through-hole walls. FIG. 1 is a 5000×SEM taken with a Leica microscope of one of the through-holes. The SEM shows that the thickness of the copper deposit is substantially the same on both sides of the through-hole walls and at the knees. The average throwing power of the through-holes was determined to be 80% and the average throwing power at the knees was determined to be 87%.

EXAMPLE 3

Figure 2:
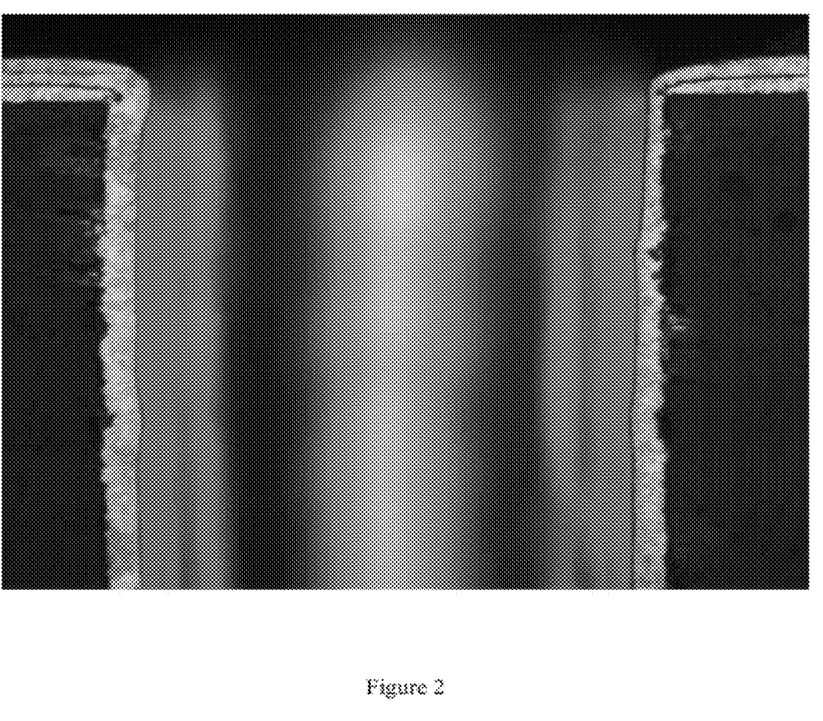
FIG. 2 is a 5000× cross-section of a through-hole 0.3 mm in diameter of an FR-4/glass-epoxy PCB with non-uniform copper deposits on each knee and wall of the through-hole.

The method of Example 2 was repeated using the same type of PCB sample with the same dimensions. The sample was electrolessly plated with copper as in Example 2 and then electroplated with the same copper electroplating bath of Example 1 except that 3-mercaptopropane sulfonic acid, sodium salt was not added to the copper electroplating bath at make-up. Copper electroplating was done under the same conditions and plating parameters as in Example 2. After copper electroplating the sample was sectioned at multiple sections to visually compare and measure the thickness of the copper deposit on the surface of the sample and the through-hole walls to determine the throwing power at the knees and the through-holes. The average throwing power at the knee was determined to be 55% and the average throwing power of the through-holes was determined to be 80%. FIG. 2 is a 5000× SEM of one of the through-hole walls. The thickness of the knee and wall of the through-hole on the left side is thicker than that on the right side. Although the throwing power of the through-holes was good, the throwing power of the knees was poor. The copper electroplating bath where 3-mercaptopropane sulfonic acid, sodium salt was not added to the bath at make-up had a lower knee throwing power than the board in Example 2 where 3-mercaptopropane sulfonic acid, sodium salt was added to the copper electroplating bath at make-up.

What is claimed is:

1. A method comprises:
   a) providing an electroplating composition comprising i) one or more sources of copper ions, ii) 5-100 ppb of 3-mercaptopropane sulfonic acid, salts thereof, or mixtures thereof and 1 mg/L to 50 mg/L of sulfopropyldisulfide, salts thereof, or mixtures thereof, wherein the 5-100 ppb of 3-mercaptopropane sulfonic acids and salts thereof, or mixtures thereof are added to the electroplating composition at an initial make-up of the electroplating composition without adding additional amounts of the 3-mercaptopropane sulfonic acid, salts thereof, or mixtures thereof during the life of the electroplating composition and electroplating cycle, iii) one or more additional brighteners, and iv) one or more levelers in amounts of 0.25 ppm to 1000 ppm, wherein the levelers are reaction products of an amine with an epoxide, wherein the amine has a formula:

wherein $R^1$, $R^2$ and $R^3$ are independently chosen from H, ($C_1$-$C_{12}$)alkyl, ($C_2$-$C_{12}$)alkenyl, and aryl and provided that $R^1$ and $R^2$ are not both H, and the epoxide has a formula:

where $Y^1$ and $Y^2$ are independently chosen from H and ($C_1$-$C_4$)alkyl, $R^6$ and $R^7$ are independently chosen from H, $CH_3$ and OH and m=1-6 and n=1-20;

b) immersing a substrate into the electroplating composition, the substrate includes a plurality of through-holes, wherein knees and walls of the plurality of through-holes are coated with a first copper layer; and c) electroplating a substantially uniform second copper layer on the first copper layer of the knees and the walls of the plurality of through-holes, wherein a throwing power of the knees is 80% and greater and a throwing power of the walls of the plurality of through-holes is 80% and greater.

2. The method of claim 1, wherein the electroplating composition further comprises one or more aldehydes.

3. The method of claim 1, wherein the electroplating composition further comprises one or more carboxylic acids.

* * * * *